(12) United States Patent
Clark et al.

(10) Patent No.: US 10,790,149 B2
(45) Date of Patent: Sep. 29, 2020

(54) METHOD OF FORMING CRYSTALLOGRAPHICALLY STABILIZED FERROELECTRIC HAFNIUM ZIRCONIUM BASED FILMS FOR SEMICONDUCTOR DEVICES

(71) Applicant: Tokyo Electron Limited, Minato-ku, Tokyo (JP)

(72) Inventors: Robert D. Clark, Fremont, CA (US); Kandabara N. Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/522,993

(22) Filed: Jul. 26, 2019

(65) Prior Publication Data

US 2020/0035493 A1     Jan. 30, 2020

Related U.S. Application Data

(60) Provisional application No. 62/703,714, filed on Jul. 26, 2018.

(51) Int. Cl.
*H01L 21/28*    (2006.01)
*H01L 29/66*    (2006.01)
*H01L 29/51*    (2006.01)

(52) U.S. Cl.
CPC .. *H01L 21/28194* (2013.01); *H01L 21/28202* (2013.01); *H01L 29/516* (2013.01); *H01L 29/6684* (2013.01)

(58) Field of Classification Search
None
See application file for complete search history.

(56) References Cited

U.S. PATENT DOCUMENTS 7,833,913 B2    11/2010    Clark
2009/0057737 A1    3/2009    Boescke et al.
(Continued)

FOREIGN PATENT DOCUMENTS

JP      2014053568 A    3/2014
KR    20150037009 A    4/2015

OTHER PUBLICATIONS

Steven M. George and Younghee Lee, "Prospects for Thermal Atomic Layer Etching Using Sequential, Self-Limiting Fluorination and Ligand-Exchange Reactions", ACS Nano 2016 10 (5), 4889-4894 DOI: 10.1021/acsnano.6b02991. (Year: 2016).*

(Continued)

*Primary Examiner* — J. E. Schoenholtz

(57) ABSTRACT

A method of forming crystallographically stabilized ferroelectric hafnium zirconium based films for semiconductor devices is described. The hafnium zirconium based films can be either doped or undoped. The method includes depositing a hafnium zirconium based film with a thickness greater than 5 nanometers on a substrate, depositing a cap layer on the hafnium zirconium based film, heat-treating the substrate to crystallize the hafnium zirconium based film in a non-centrosymmetric orthorhombic phase, a tetragonal phase, or a mixture thereof. The method further includes removing the cap layer from the substrate, thinning the heat-treated hafnium zirconium based film to a thickness of less than 5 nanometers, where the thinned heat-treated hafnium zirconium based film maintains the crystallized non-centrosymmetric orthorhombic phase, the tetragonal phase, or the mixture thereof.

20 Claims, 8 Drawing Sheets

(56) References Cited

U.S. PATENT DOCUMENTS

| | | | |
|---|---|---|---|
| 2009/0261395 A1 | 10/2009 | Boescke | |
| 2014/0070289 A1 | 3/2014 | Tanaka et al. | |
| 2015/0340372 A1 | 11/2015 | Pandey et al. | |
| 2019/0067488 A1* | 2/2019 | Tsai | H01L 27/0886 |
| 2019/0244973 A1* | 8/2019 | Yoo | G11C 11/2273 |
| 2020/0020762 A1* | 1/2020 | Frank | H01L 21/02686 |

OTHER PUBLICATIONS

Park, M., Lee, Y., Mikolajick, T., Schroeder, U., & Hwang, C. (2018). Review and perspective on ferroelectric HfO2-based thin films for memory applications. MRS Communications, 8(3), 795-808. doi:10.1557/mrc.2018.175. (Year: 2018).*

Johannes Müller, et. al., "Ferroelectric Hafnium Oxide Based Materials and Devices: Assessment of Current Status and Future Prospects", 2014 ECS Trans. 64 159. (Year: 2014).*

Hsain, H., Lee, Y. , Parsons, G., and Jones, J., "Compositional dependence of crystallization temperatures and phase evolution in hafniazirconia (HfxZr1-x)O2 thin films", Appl. Phys. Lett. 116, 192901 (2020); https://doi.org/10.1063/5.0002835. (Year: 2020).*

Batra R., Tran, H. and Ramprasad, R., "Stabilization of metastable phases in hafnia owing to surface energy effects", Appl. Phys. Lett. 108, 172902 (2016); https://doi.org/10.1063/1.4947490. (Year: 2016).*

Bald Engineering, "Single Atomic Layer Ferroelectric on Silicon by PVD ZrO2", Jan. 2, 2018 downloaded from URL<http://www.blog.baldengineering.com/2018/01/single-atomic-layer-ferroelectric-on.html> on Jun. 7, 2020. (Year: 2018).*

Atomic Layer Etch (ALE) downloaded from URL<https://semiengineering.com/knowledge_centers/manufacturing/process/atomic-layer-etch/> on Jun. 7, 2020. (Year: 2020).*

Korean Intellectual Property Office, International Search Report and Written Opinion for International application No. PCT/US2019/043595, dated Nov. 15, 9 pages.

L. Xu et al., "Ferroelectric phase stabilization of HfO2 by nitrogen doping", Applied Physics Express 9, 2016, pp. 09151-1-091501-4.

A. Toriumi, "High-k, Higher-k and Ferroelectric HfO2", ECS Transactions 80(1), 2017, pp. 29-40.

J. Muller et al., "Ferroelectric Hafnium Oxide: A CMOS-compatible and highly scalable approach to future ferroelectric memories", IEDM, 2013, pp. 10.8.1-10.4.4.

J. Muller et al., "Ferroelectric Zr0.5Hf0.5O2 thin films for nonvolatile memory applications", Applied Physics Letters 99, 2011, pp. 112901-1-112901-3.

T. Nishimura et al., "Ferroelectricity of nondoped thin HfO2 films in TiN/HfO2/TiN stacks", Jap. Journal Appl. Phys. 55, 2016, pp. 08PB01-1-08PB01-4.

* cited by examiner

METHOD OF FORMING CRYSTALLOGRAPHICALLY STABILIZED FERROELECTRIC HAFNIUM ZIRCONIUM BASED FILMS FOR SEMICONDUCTOR DEVICES

CROSS-REFERENCE TO RELATED APPLICATIONS

This application is related to and claims priority to U.S. Provisional Patent Application Ser. No. 62/703,714 filed on Jul. 26, 2018, the entire contents of which are herein incorporated by reference.

FIELD OF INVENTION

The present invention relates to high dielectric constant (high-k) materials for semiconductor devices, and more particularly to methods of forming crystallographically stabilized ferroelectric hafnium zirconium based films.

BACKGROUND OF THE INVENTION

Hafnium and zirconium based films find applications in various semiconductor devices. In order to use ferroelectric hafnium and zirconium oxide based films (e.g., $Hf_xZr_{1-x}O_2$, $0<x<1$) for some device applications, it is necessary to have scaled films with a thickness below about 5 nm that exhibit ferroelectric behavior. This requires a crystalline film that has either a non-centrosymmetric orthorhombic phase or a tetragonal phase which can convert to the non-centrosymmetric phase under electrical stress. However, it is very difficult to crystallize such films with a thickness below about 5 nm, and to date $Hf_xZr_{1-x}O_2$ films deposited with a thickness below about 3 nm have not been shown to exhibit ferroelectric behavior at all, and show degraded characteristics as well. In addition, as films become thinner, crystallization requires higher and higher temperatures. Such high temperatures are not compatible with the thermal budgets required for back end processing and can also be problematic in front end processing. This includes, for example, the use of replacement high-k gate stacks when forming transistors, which typically is done after source and drain formation.

$ZrO_2$ and $HfO_2$ can both form monoclinic, tetragonal, and cubic polymorphs (crystallographic forms) but it has been shown that the cubic form is the most stable form at typical semiconductor processing temperatures. Calculations indicate that the tetragonal form has the highest band gap and permittivity, with predicted dielectric constants of about 70 and 38 for $ZrO_2$ and $HfO_2$, respectively. Therefore, the tetragonal form, and even the cubic form, both of which have higher dielectric constants than the monoclinic form, may be desirable in applications where high dielectric constants are needed. It has been shown experimentally, that the tetragonal form of $ZrO_2$ is easier to obtain than $HfO_2$ at typical semiconductor processing temperatures, but annealing at high temperature reduces the tetragonal forms of both $ZrO_2$ and $HfO_2$. In general, $HfO_2$ and $ZrO_2$ have many similar properties and are completely miscible in the solid state.

Thus, it would be beneficial to be able to form a highly crystalline ferroelectric $Hf_xZr_{1-x}O_2$ and other hafnium and zirconium based films with a reasonable thermal budget and a thickness below 5 nm.

SUMMARY OF THE INVENTION

A method of forming crystallographically stabilized ferroelectric hafnium zirconium based films for semiconductor devices is described. The hafnium zirconium based films can be either doped or undoped. The method includes depositing a hafnium zirconium based film with a thickness greater than 5 nanometers (nm) on a substrate, depositing a cap layer on the hafnium zirconium based film, heat-treating the substrate to crystallize the hafnium zirconium based film in a non-centrosymmetric orthorhombic phase, a tetragonal phase, or a mixture thereof. The method further includes removing the cap layer from the substrate, thinning the heat-treated hafnium zirconium based film to a thickness of less than 5 nm, where the thinned heat-treated hafnium zirconium based film maintains the crystallized non-centrosymmetric orthorhombic phase, tetragonal phase, or a mixture thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

A substrate processing method is provided for forming hafnium zirconium based films that can be either doped or undoped. The method includes depositing a hafnium zirconium based film with a thickness greater than 5 nm on a substrate, depositing a cap layer on the hafnium zirconium based film, heat-treating the substrate to crystallize the hafnium zirconium based film in a non-centrosymmetric orthorhombic phase, a tetragonal phase, or a mixture thereof. The presence of the cap layer above the hafnium zirconium based film and the presence of the substrate below the hafnium zirconium based film applies film stress to the hafnium zirconium based film during the heat-treating process, thereby crystallizing the hafnium zirconium based film in the non-centrosymmetric orthorhombic phase, a tetragonal phase, or a mixture thereof. Thereafter, the method further includes removing the cap layer from the substrate, thinning the heat-treated hafnium zirconium based film to a thickness of less than 5 nm, where the thinned heat-treated hafnium zirconium based film maintains the crystallized non-centrosymmetric orthorhombic phase or tetragonal phase, and exhibits ferroelectric behavior during electrical stressing.

Figure 1A:
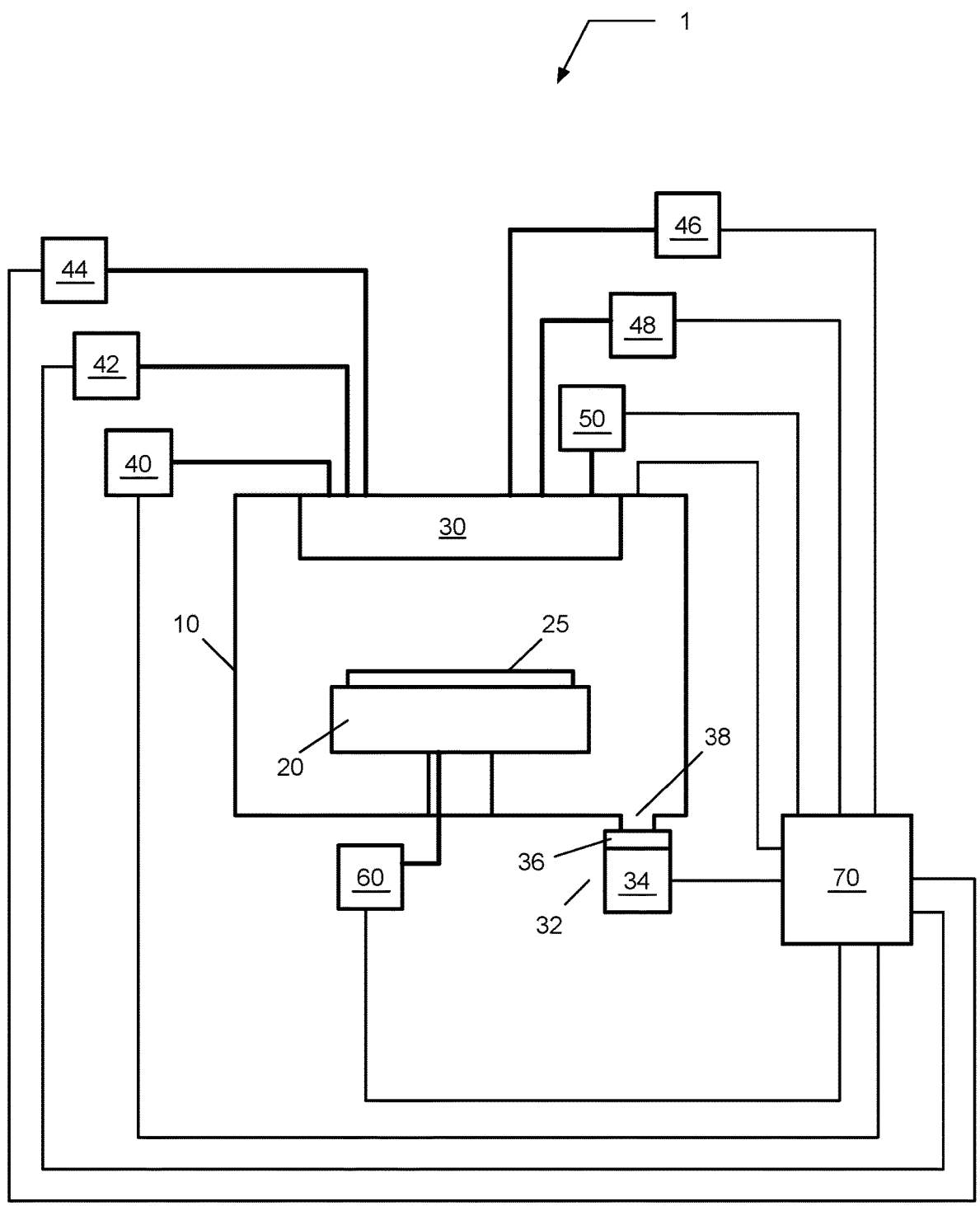
FIG. 1A depicts a schematic view of an atomic layer deposition (ALD) system according to an embodiment of the invention.

Referring now to the drawings, FIG. 1A illustrates an ALD system 1 for depositing hafnium zirconium based films on a substrate according to embodiments of the invention. The ALD system 1 includes a process chamber 10 having a substrate holder 20 configured to support a substrate 25, upon which the hafnium zirconium based film is formed. The process chamber 10 further contains an upper assembly 30 (e.g., a showerhead) coupled to a hafnium precursor supply system 40, a zirconium precursor supply system 42, a purge gas supply system 44, an oxygen-containing gas supply system 46, a nitrogen-containing gas supply system 48, and a dopant gas supply system 50. Additionally, the ALD system 1 includes a substrate temperature control system 60 coupled to substrate holder 20 and configured to elevate and control the temperature of substrate 25. Furthermore, the ALD system 1 includes a controller 70 that can be coupled to process chamber 10, substrate holder 20, upper assembly 30 configured for introducing process gases into the process chamber 10, hafnium precursor supply system 40, zirconium precursor supply system 42, purge gas supply system 44, oxygen-containing gas supply system 46, nitrogen-containing gas supply system 48, dopant gas supply system 50, and substrate temperature control system 60. Although not shown, the ALD system 1 can further contain an oxygen- and nitrogen-containing gas supply system.

Alternatively, or in addition, controller 70 can be coupled to one or more additional controllers/computers (not shown), and controller 70 can obtain setup and/or configuration information from an additional controller/computer.

In FIG. 1A, singular processing elements (10, 20, 30, 40, 42, 44, 46, 48, 50, and 60) are shown, but this is not required for the invention. The ALD system 1 can include any number of processing elements having any number of controllers associated with them in addition to independent processing elements.

The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1A, the ALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch ALD system capable of processing multiple substrates simultaneously may be utilized for depositing the doped hafnium zirconium based films described in the embodiments of the invention.

The hafnium precursor supply system 40 and the zirconium precursor supply system 42 are configured to alternately or simultaneously introduce a hafnium precursor and a zirconium precursor to process chamber 10. The alternation of the introduction of the hafnium precursor and the zirconium precursor can be cyclical, or it may be acyclical with variable time periods between introduction of the hafnium and zirconium precursors.

According to embodiments of the invention, several methods may be utilized for introducing the hafnium and zirconium precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired hafnium zirconium stoichiometry can be attained within the deposited film. Another method of delivering a hafnium precursor and a zirconium precursor includes separately controlling two or more different liquid sources (neat precursors or precursors solutions), which are then mixed prior to entering a common vaporizer. This method may be utilized when the precursors are compatible in solution or in liquid form and they have similar vaporization characteristics. Yet another method of delivering a hafnium precursor and a zirconium precursor includes controlling the flow of a liquid precursor mixture (neat precursors or precursors solutions) to a common vaporizer. Other methods include the use of compatible mixed solid or liquid precursors within a bubbler. Liquid source precursors may include neat liquid hafnium and zirconium precursors, or solid or liquid hafnium and zirconium precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the hafnium and zirconium precursors within a gas pulse, it is possible to deposit hafnium zirconium based films with desired stoichiometries. According to embodiments of the invention, the hafnium zirconium based films can contain between 5 and 95 atomic percent zirconium (5%<% Zr/(% Zr+% Hf)<95%), and between 5 and 95 atomic percent hafnium (5%<% Hf/(% Zr+% Hf)<95%). Examples of dopant element concentrations in doped hafnium zirconium based films are between 0.1 and 20 atomic percent (0.1%<% D'/(% Zr+% Hf+% D')<20%, where D' includes one or more dopant elements), or between 1 and 10 atomic percent.

Embodiments of the invention may utilize a wide variety of hafnium and zirconium precursors. For example, representative examples include: Hf(O$^t$Bu)$_4$ (hafnium tert-butoxide, HTB), Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(O$^t$Bu)$_4$ (zirconium tert-butoxide, ZTB), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Hf(mmp)$_4$, Zr(mmp)$_4$, HfCl$_4$, ZrCl$_4$, ZrCp$_2$Me$_2$, Zr(tBuCp)$_2$Me$_2$, and Zr(NiPr$_2$)$_4$. In one example, the hafnium and zirconium precursors may have the same ligands (e.g., HTB and ZTB), thereby preventing any possible detrimental ligand exchange between the precursors.

Embodiments of the invention may utilize one or more of a wide variety of different dopant elements selected from Group II, Group XIII, silicon, and rare earth elements of the Periodic Table. Some examples include Al, La, Y, Mg, and Si. The dopant elements may be provided using any dopant gases that have sufficient reactivity, thermal stability, and volatility. The dopant gases may be delivered to the process chamber using bubbling or DLI methods described above for hafnium and zirconium precursors.

Embodiments of the inventions may utilize a wide variety of different rare earth precursors. For example, many rare earth precursors have the formula:

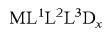

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, beta-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of beta-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of rare earth precursors include:
Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3.CH_3(OCH_2CH_2)_3OCH_3$, $La(C_{11}H_{19}O_2)_3.CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3.CH_3(OCH_2CH_2)_3OCH_3$, $Ce(C_{11}H_{19}O_2)_3.CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3.CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 1A, the oxygen-containing gas supply system 46 is configured to introduce an oxygen-containing gas to the process chamber 10. The oxygen-containing gas can include, but is not limited to, $O_2$, water ($H_2O$), or peroxide ($H_2O_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). According to one embodiment of the invention, an oxygen- and nitrogen-containing gas may be utilized, for example, NO, $NO_2$, or $N_2O$, or a combination thereof, and optionally an inert gas such as Ar.

Embodiments of the inventions may utilize a wide variety of different Group II (alkaline earth) precursors. For example, many Group II precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, beta-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of beta-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of Group II (alkaline earth) precursors include:

Be precursors: $Be(N(SiMe_3)_2)_2$, $Be(TMPD)_2$, and $BeEt_2$.
Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4Cp)_2$, and $Ca(Me_5Cp)_2$.

Sr precursors: Bis(tert-butylacetamidinato)strontium (TBAASr), Sr—C, Sr-D, $Sr(N(SiMe_3)_2)_2$, $Sr(THD)_2$, $Sr(THD)_2$(tetraglyme), $Sr(iPr_4Cp)_2$, $Sr(iPr_3Cp)_2$, and $Sr(Me_5Cp)_2$.

Ba precursors: Bis(tert-butylacetamidinato)barium (TBAABa), Ba—C, Ba-D, $Ba(N(SiMe_3)_2)_2$, $Ba(THD)_2$, $Ba(THD)_2$(tetraglyme), $Ba(iPr_4Cp)_2$, $Ba(Me_5Cp)_2$, and $Ba(nPrMe_4Cp)_2$.

Embodiments of the inventions may utilize a wide variety of different precursors for incorporating Group XIII elements (B, Al, Ga, In, Tl) into the hafnium zirconium based films. For example, many Al precursors have the formula:

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, beta-diketonates, ketoiminates, silanoates, and carboxylates. D ligands may be selected from groups of ethers, furans, pyridines, pyroles, pyrolidines, amines, crown ethers, glymes, and nitriles.

Other examples of Al precursors include: $Al_2Me_6$, $Al_2Et_6$, $[Al(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Ga precursors include $GaCl_3$ and $GaH_3$, examples of In precursors include $InCl_3$ and $InH_3$, and examples of B precursors include borane ($BH_3$), diborane ($B_2H_6$), tri-ethylboron ($BEt_3$), triphenylboron ($BPh_3$), borane adducts such as $Me_3N:BH_3$, and $BCl_3$.

Embodiments of the invention may utilize a wide variety of silicon precursors for incorporating silicon into the hafnium zirconium based films. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), and alkylaminosilane compounds. Examples of alkylaminosilane compounds include, but are not limited to, di-isopropylaminosilane ($H_3Si(NPr_2)$), bis(tert-butylamino)silane (($C_4H_9$(H)N$)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(di-isopropylamino)silane ($H_2Si(NPr_2)_2$), tris(isopropylamino)silane ($HSi(NPr_2)_3$), and (di-isopropylamino)silane ($H_3Si(NPr_2)$)

Still referring to FIG. 1A, the purge gas supply system 44 is configured to introduce a purge gas to process chamber 10. For example, the introduction of purge gas may occur between introductions of pulses of hafnium and zirconium precursors and an oxygen-containing gas, a nitrogen-containing gas, an oxygen- and a nitrogen-containing gas, or a dopant gas to the process chamber 10. The purge gas can comprise an inert gas, such as a noble gas (i.e., He, Ne, Ar, Kr, Xe), nitrogen ($N_2$), or hydrogen ($H_2$).

Furthermore, ALD system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the processing chamber 10 and any other component within the ALD system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular hafnium zirconium based material and doped hafnium zirconium based material on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the processing chamber 10. The pressure control system 32 can, for example, be configured to control the process chamber pressure between about 0.1 Torr and about 100 Torr during deposition of the doped hafnium zirconium based materials.

The hafnium precursor supply system 40, the zirconium precursor supply system 42, the purge gas supply system 44, the oxygen-containing gas supply system 46, the nitrogen-containing gas supply system 48, and the dopant gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for hafnium and zirconium precursors can be between 0.3 and 3 sec, for example 1 sec. Exemplary gas pulse lengths for a dopant gas can be between 0.1 and 3 sec, for example 0.3 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec.

Still referring to FIG. 1A, controller 70 can comprise a microprocessor, memory, and a digital I/O port capable of generating control voltages sufficient to communicate and activate inputs to the ALD system 1 as well as monitor outputs from the ALD system 1. Moreover, the controller 70 may be coupled to and may exchange information with the process chamber 10, substrate holder 20, upper assembly 30, hafnium precursor supply system 40, zirconium precursor supply system 42, purge gas supply system 44, oxygen-containing gas supply system 46, nitrogen-containing gas supply system 48, dopant gas supply system 50, substrate temperature control system 60, and pressure control system 32. For example, a program stored in the memory may be utilized to activate the inputs to the aforementioned components of the deposition system 1 according to a process recipe in order to perform a deposition process.

The controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs.

Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the ALD system 1, or it may be remotely located relative to the ALD system 1. For example, the controller 70 may exchange data with the ALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 1B:
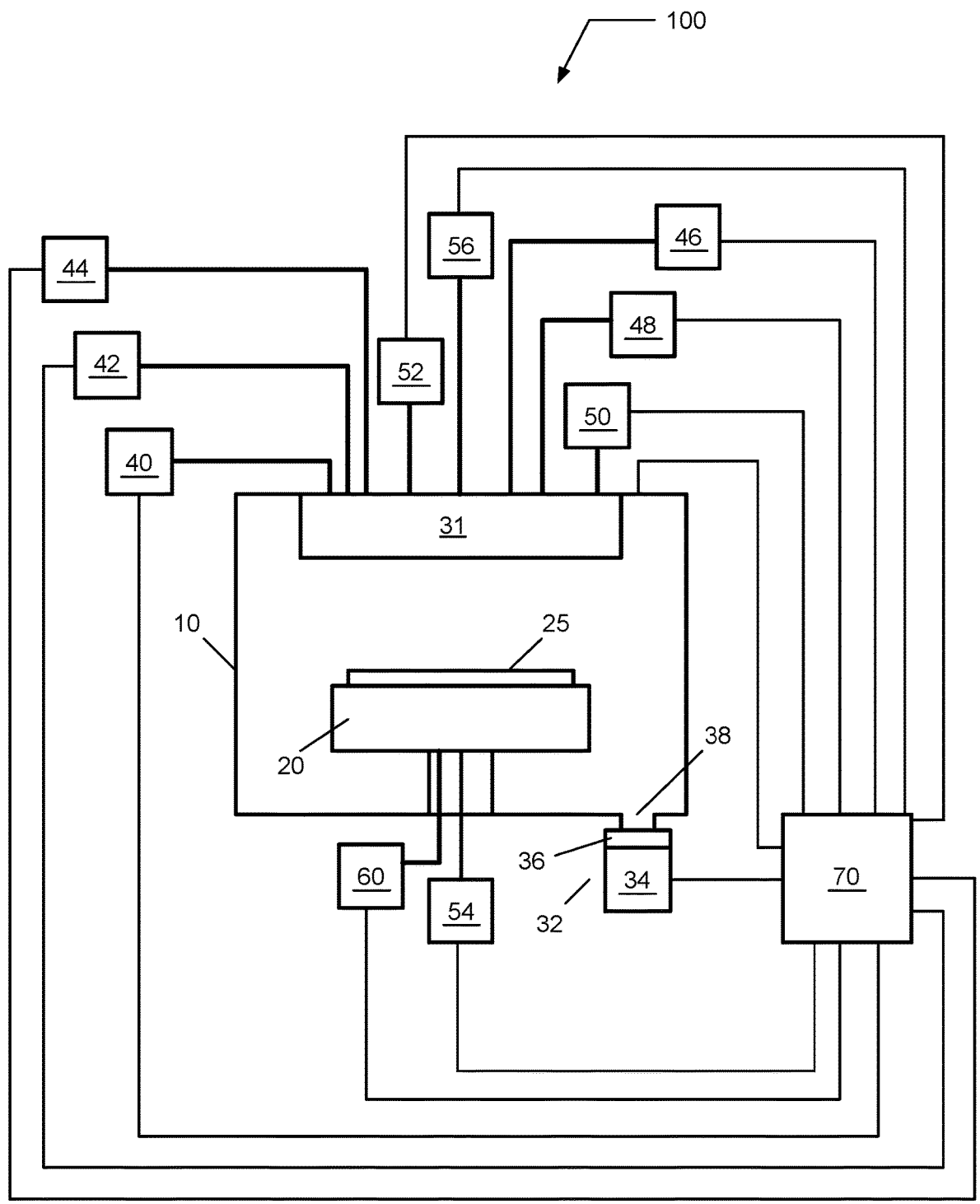
FIG. 1B depicts a schematic view of a plasma-enhanced atomic layer deposition system (PEALD) system according to an embodiment of the invention.

FIG. 1B illustrates a PEALD system 100 for depositing a hafnium zirconium based films on a substrate according to an embodiment of the invention. The PEALD system 100 is similar to the ALD system 1 described in FIG. 1A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing Na, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20 and further configured for introducing process gases into the process chamber 10. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, it-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the PEALD system 100 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the PEALD system 100 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 25. The remote plasma system 56 can, for example, contain a microwave frequency generator. The process chamber pressure can be between about 0.1 Torr and about 10 Torr, or between about 0.2 Torr and about 3 Torr.

FIGS. 2A-2F schematically illustrate pulse sequences for forming hafnium zirconium based films according to embodiments of the invention. According to embodiments of the invention, sequential and alternating pulse sequences are used to deposit the different components (i.e., hafnium, zirconium, optional dopant elements, oxygen, and nitrogen) of the hafnium zirconium based films. Since ALD and PEALD processes typically deposit less than a monolayer of material per gas pulse, it is possible to form a homogenous material using separate deposition sequences of the different components of the film. Depending on the gas selections and combination of pulse sequences, hafnium zirconium based films and that may be formed include hafnium zirconium oxide films, doped hafnium zirconium oxide films, hafnium zirconium nitride film, doped hafnium zirconium nitride films, hafnium zirconium oxynitride films, and doped hafnium zirconium oxynitride films.

Figure 2A:
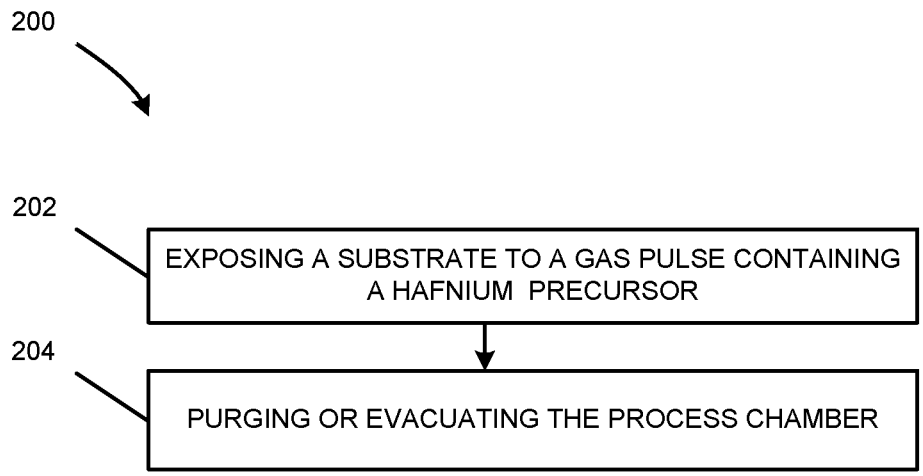
FIGS. 2A-2F schematically illustrate pulse sequences for forming hafnium zirconium based films according to embodiments of the invention.
Figure 2B:
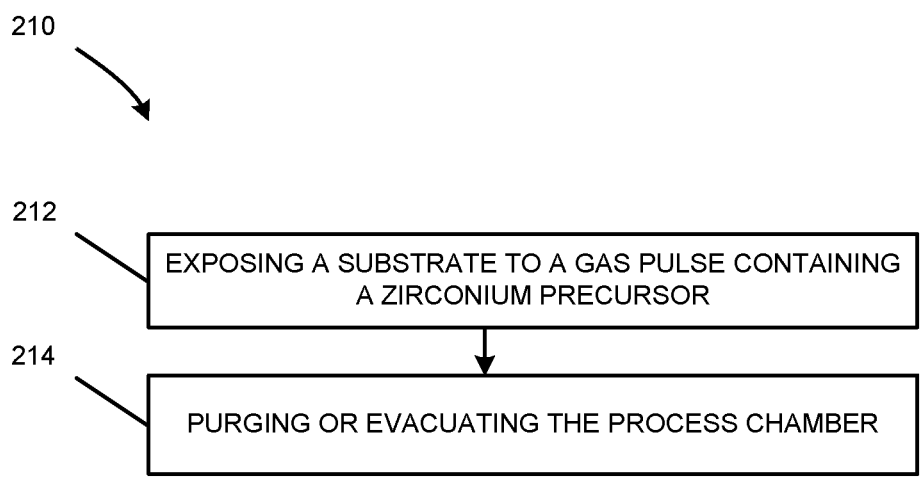
Figure 2C:
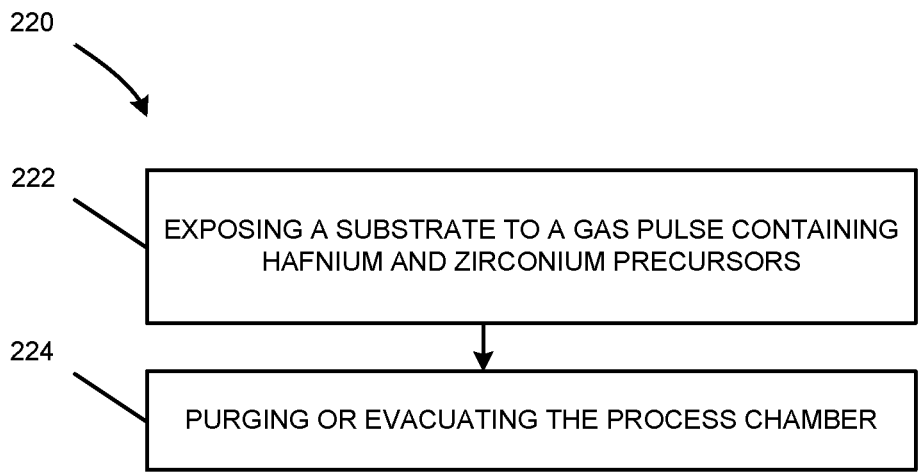
Figure 2D:
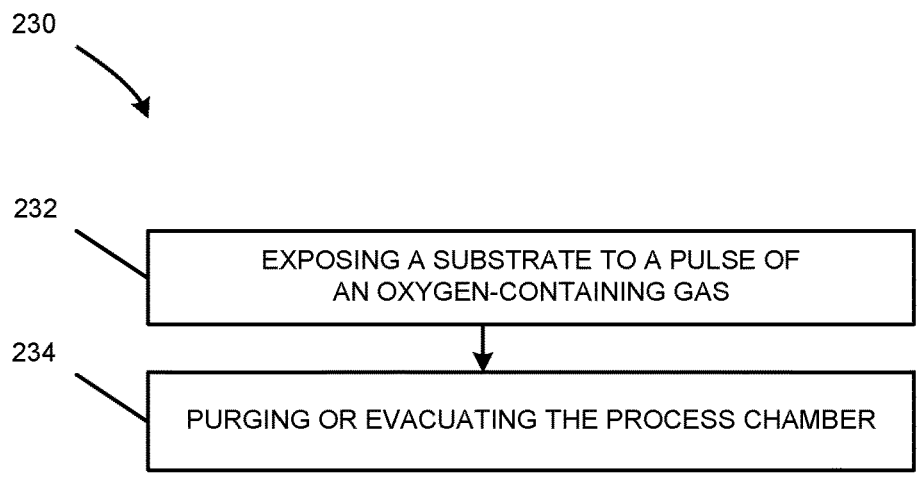
Figure 2E:
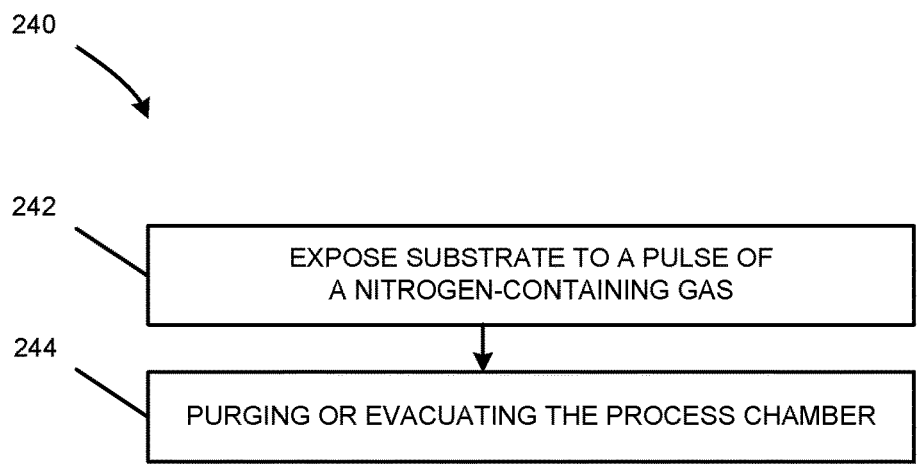
Figure 2F:
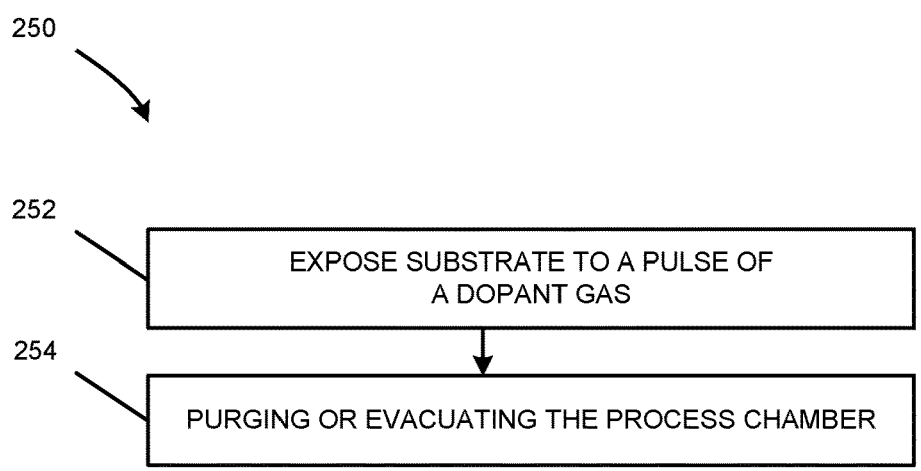

FIG. 2A depicts a pulse sequence 200 for depositing a hafnium element from a hafnium precursor in step 202. FIG. 2B depicts a pulse sequence 210 for depositing a zirconium element from a zirconium precursor in step 212. FIG. 2C depicts a pulse sequence 220 for simultaneously depositing hafnium and zirconium elements from hafnium and zirconium precursors in step 222. FIG. 2D depicts a pulse sequence 230 for incorporating oxygen into a hafnium zirconium based film from exposure to an oxygen-containing gas in step 232. FIG. 2E depicts a pulse sequence 240 for incorporating nitrogen into a hafnium zirconium based film from exposure to a nitrogen-containing gas in step 242. FIG. 2F depicts a pulse sequence 250 for depositing one or more dopant elements from a dopant gas in step 252.

According to the embodiments depicted in FIGS. 2A-2F, each of the pulse sequences 200, 210, 220, 230, 240, and 250 may include a respective purge or evacuation step 204, 214, 224, 234, 244, 254 to remove unreacted gas or byproducts from the process chamber. According to another embodiment of the invention, one or more of the purge or evacuation steps 204, 214, 224, 234, 244, 254 may be omitted.

According to embodiments of the invention, different combinations of the pulse sequences depicted in FIGS. 2A-2F may be utilized for depositing different hafnium zirconium based films, including doped hafnium zirconium oxides ($Hf_xZr_yD'_kO_m$, where D' contains one or more dopant elements and x, y, k, and m are non-zero numbers), doped hafnium zirconium nitrides ($Hf_xZr_yD'_kN_n$, where x, y, k, m, and n are non-zero numbers), and doped hafnium zirconium oxynitrides ($Hf_xZr_yD'_kO_mN_n$, where x, y, k, m, and n are non-zero numbers). Below are exemplary doped hafnium zirconium based films that may be deposited by the teachings of embodiments of the invention. As those skilled in the art will readily recognize, a wide variety of other hafnium zirconium based films not shown below may be deposited. Furthermore, impurities such as carbon and halides may be incorporated into these materials from the precursor ligands. Therefore, embodiments of the invention are not limited to the materials listed below. For example, other doped hafnium zirconium based materials may contain one or more dopant elements D', for example two, three, four, or more.

Examples of Doped Hafnium Zirconium Based Materials

Doped Hafnium Zirconium Oxides: $Hf_xZr_ySi_kO_m$, $Hf_xZr_yAl_kO_m$, $Hf_xZr_yY_kO_m$, and $Hf_xZr_yMg_kO_m$.

Doped Hafnium Zirconium Nitrides: $Hf_xZr_ySi_kN_n$, $Hf_xZr_yAl_kN_n$, $Hf_xZr_yY_kN_n$, and $Hf_xZr_yMg_kN_n$.

Doped Hafnium Zirconium Oxynitrides: $Hf_xZr_ySi_kO_mN_n$, $Hf_xZr_yAl_kO_mN_n$, $Hf_xZr_yY_kO_mN_n$, and $Hf_xZr_yMg_kO_mN_n$.

Hafnium Zirconium Oxide Films and Doped Hafnium Zirconium Oxide Films

Figures 3A, 3B:
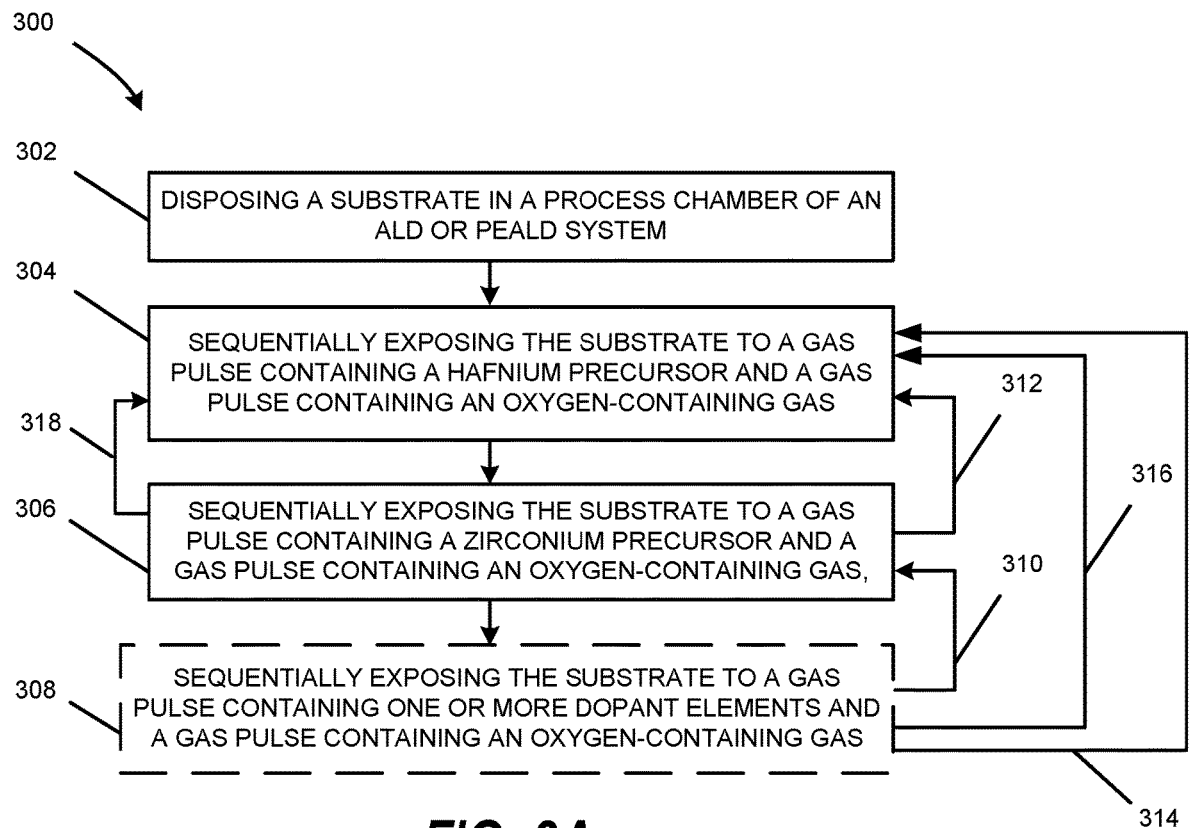
FIGS. 3A-3B are process flow diagrams for forming hafnium zirconium oxide films and doped hafnium zirconium oxide films according to embodiments of the invention.

FIGS. 3A-3B are process flow diagrams for forming hafnium zirconium oxide films and doped hafnium zirconium oxide films according embodiments of the invention. The process flows of FIGS. 3A-3B may be performed by the ALD/PEALD systems 1/100 of FIGS. 1, 2, or any other suitable ALD/PEALD systems configured to perform an ALD/PEALD process.

In FIG. 3A, the process flow 300 begins when a substrate, such as a semiconductor substrate, is disposed in a process chamber of an ALD or PEALD system in step 302. In step 304, the substrate is sequentially exposed to a gas pulse containing a hafnium precursor and a gas pulse containing an oxygen-containing gas. In step 306, the substrate is sequentially exposed to a gas pulse containing a zirconium precursor and a gas pulse containing the oxygen-containing gas. Optionally, in step 308, the substrate is sequentially exposed to a gas pulse containing one or more dopant elements and a gas pulse containing the oxygen-containing gas. The oxygen-containing gas can include $O_2$, $H_2O$, $H_2O_2$, ozone, or plasma excited oxygen, or a combination thereof, and optionally an inert gas such as Ar.

In step 304, the hafnium precursor reacts with the surface of the heated substrate to form a chemisorbed layer less than a monolayer thick containing the hafnium metal element. The chemisorbed layer is less than a monolayer thick due to the large size of the precursor compared to the size of the hafnium metal element. Next, oxygen from the gas pulse containing oxygen-containing gas reacts with the chemisorbed surface layer and generates a hydroxylated surface. By repeating this sequential gas exposure, i.e., by alternating the two exposures a plurality of times, it is possible to achieve layer by layer growth of about 1 angstrom ($10^{-10}$ m) per cycle. As will be described below, according to another embodiment of the invention, the process chamber may be purged or evacuated to removing any unreacted hafnium and zirconium precursor, byproducts, and oxygen-containing gas from the process chamber between the sequential and alternating gas pulses.

According to embodiments of the invention, the sequential and alternating exposure steps 304, 306, 308 may be repeated a predetermined number of times, as shown by the process flow arrow 314, until a doped hafnium zirconium oxide film ($Hf_xZr_yD'_kO_m$, where x, y, k, and m are non-zero numbers) with a desired thickness has been formed. The desired film thickness can depend on the type of semiconductor device or device region being formed. For example, the film thickness can be greater than 5 nanometers (nm), greater than 10 nm, greater than 15 nm, greater than 20 nm, greater than 30 nm, or greater than 50 nm. For example, the film thickness can be between greater than 5 nm and 50 nm, between greater than 5 nm and 30 nm, between greater than 5 nm and 20 nm, or between about 5 nm and 10 nm.

According the embodiment depicted in FIG. 3A, the process flow 300 includes a deposition cycle containing sequential and alternating exposures of a gas pulse containing a hafnium precursor, a gas pulse containing an oxygen-containing gas, a gas pulse containing a zirconium precursor, a gas pulse containing an oxygen-containing gas, an optional gas pulse containing one or more dopant elements, and a gas pulse containing an oxygen-containing gas. According to another embodiment of the invention, the order of the sequential and alternating exposure steps 304, 306, 308 of the deposition cycle can be changed to effect film growth and film composition.

According to one embodiment of the invention, each of the sequential exposure steps 304, 306, 308 may be independently repeated a predetermined number of times. In one example, if step 304 is denoted by pulse sequence A, step 306 is denoted by a pulse sequence B, and step 308 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium oxide films containing different amounts and different depth profiles of hafnium, zirconium, dopant elements, and oxygen in the resulting doped hafnium zirconium oxide film.

According to another embodiment of the invention, additional pulse sequences containing additional dopant elements may be added to the process flow depicted in FIG. 3A to form doped hafnium zirconium oxide films containing additional dopant elements. In other words, additional dopant elements may be incorporated into the films by adding pulse sequences containing a gas pulse containing the additional dopant elements and gas pulse containing an oxygen-containing gas. In one example, a pulse sequence C containing a gas pulse containing additional dopant elements and a gas pulse containing an oxygen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 300 may further include steps of purging or evacuating the process chamber after each gas pulse. The purging or evacuating steps can aid in removing any unreacted hafnium precursor, zirconium precursor, byproducts, dopant gas, and oxygen-containing gas from the process chamber between the alternating pulses of hafnium precursor, zirconium precursor, oxygen-containing gas, and dopant gas.

The exposure steps 304 and 306 may be repeated in sequence a predetermined number of times, as shown by the process flow arrow 312, and exposure steps 306 and 308 may be repeated in sequence a predetermined number of times, as shown by the process flow arrow 310, and exposure steps 304 and 308 may be repeated in sequence a predetermined number of times, as shown by the process flow arrow 314. Furthermore, the exposure steps 304, 306, 308 may be repeated a predetermined number of times as shown by the process arrow 316.

According to one embodiment of the invention, the exposure step 308 is optional and may be omitted in order to deposit hafnium zirconium oxide films that are undoped. Furthermore, the exposure steps 304 and 306 may be repeated a predetermined number of times as shown by the process arrow 318.

FIG. 3B is a process flow diagram for forming a doped hafnium zirconium oxide film according to yet another embodiment of the invention. As seen in FIG. 3B, the process 320 begins when a substrate, such as a semiconductor substrate, is disposed in a process chamber of an ALD or PEALD system in step 322.

In step 324, the substrate is sequentially exposed to a gas pulse containing hafnium and zirconium precursors and a gas pulse with an oxygen-containing gas. The relative concentration of the hafnium and zirconium precursors may be independently controlled to tailor the composition of the resulting doped hafnium zirconium oxide film. In step 326, the substrate is sequentially exposed to a gas pulse containing one or more dopant elements and gas pulse containing an oxygen-containing gas. According to one embodiment of the invention, the sequential exposure steps 324 and 326 may be repeated a predetermined number of times as depicted by the process flow arrow 328. Furthermore, each of the exposure steps 324 and 326 may be independently repeated a predetermined number of times.

In alternative embodiments, the hafnium and zirconium precursors may be pulsed together, and either or both may be pulsed with the one or more dopant elements to deposit a doped hafnium zirconium oxide film.

According to another embodiment of the invention, the process flow 320 may further include steps of purging or evacuating the process chamber after each gas pulse. The purging or evacuating steps can aid in removing any unreacted hafnium precursor, zirconium precursor, byproducts, oxygen-containing gas, and dopant gas from the process chamber.

According to one embodiment of the invention, the exposure step 326 is optional and may be omitted in order to deposit hafnium zirconium oxide films that are undoped.

Hafnium Zirconium Nitride and Doped Hafnium Zirconium Nitride Films

Figure 4A:
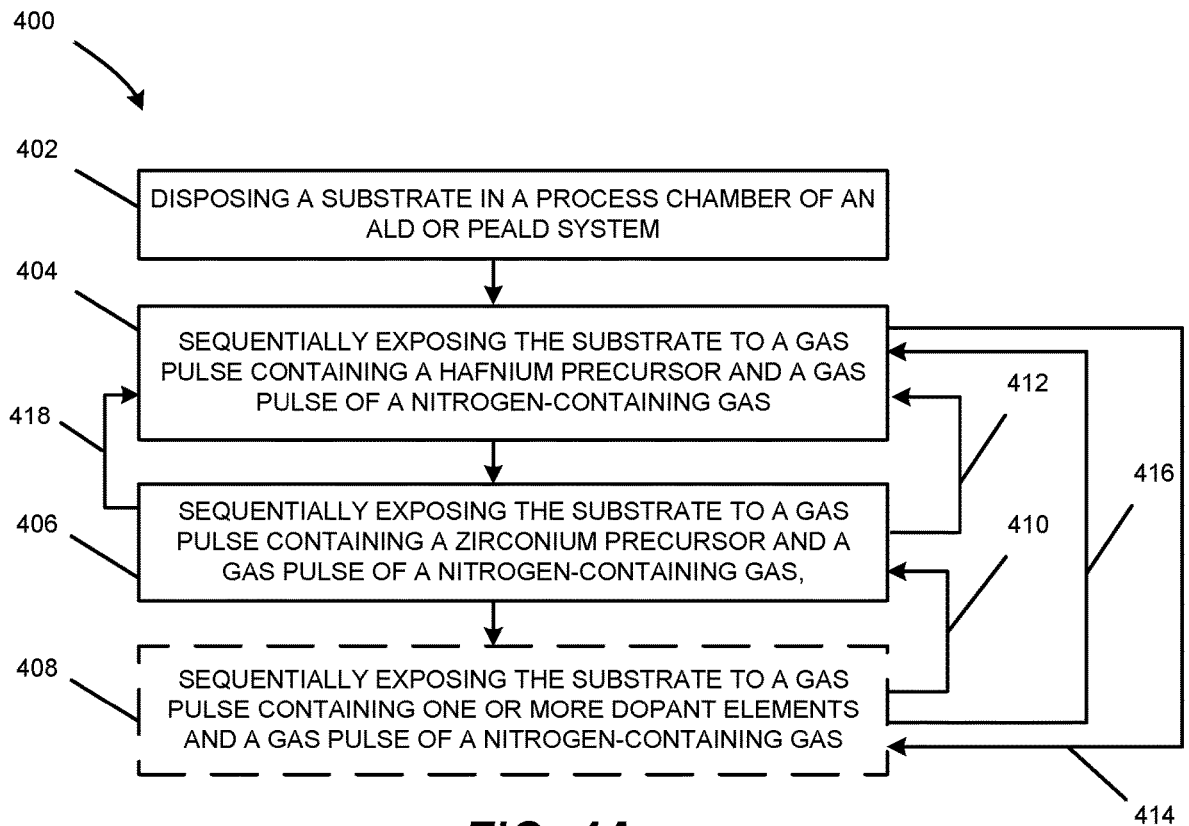
FIGS. 4A-4B are process flow diagrams for forming hafnium zirconium nitride films and doped hafnium zirconium nitride films according to embodiments of the invention.
Figure 4B:
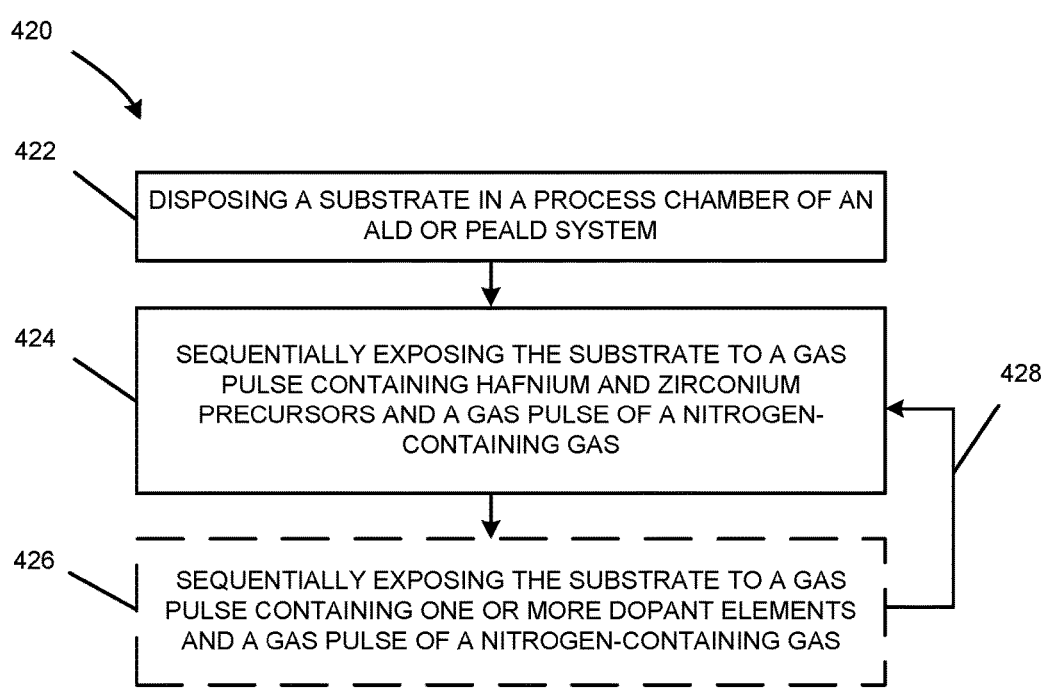

FIGS. 4A-4B are process flow diagrams for forming hafnium zirconium nitride films and doped hafnium zirconium nitride films according embodiments of the invention. The process flows of FIG. 4A-4B may be performed by the ALD/PEALD systems 1/100 of FIGS. 1, 2, or any other suitable ALD/PEALD systems configured to perform an ALD/PEALD process.

In FIG. 4A, the process 400 begins when a substrate, such as a semiconductor substrate, is disposed in a process chamber of an ALD or PEALD system in step 402. In step 404, the substrate is sequentially exposed to a gas pulse containing a hafnium precursor and a gas pulse containing a nitrogen-containing gas. In step 406, the substrate is sequentially exposed to a gas pulse containing a zirconium precursor and a gas pulse containing the nitrogen-containing gas. In step 408, the substrate is sequentially exposed to a gas pulse containing one or more dopant elements and a gas pulse containing the nitrogen-containing gas. The nitrogen-containing gas can include $NH_3$, $N_2H_4$, $C_1$-$C_{10}$ alkylhydrazine compounds, or plasma excited nitrogen, or a combination thereof. According to one embodiment, the nitrogen-containing gas may further contain plasma excited hydrogen. Alternately, the nitrogen-containing gas may be replaced by plasma excited hydrogen.

In step 404, the hafnium precursor reacts with the surface of the heated substrate to form a chemisorbed layer less than a monolayer thick containing the hafnium metal element. The substrate surface may contain hydroxyl groups. The chemisorbed layer is less than a monolayer thick due to the large size of the precursor compared to the size of the hafnium metal element. Next, nitrogen from the gas pulse containing the nitrogen-containing gas reacts with the chemisorbed surface layer and forms a nitrogen-terminated surface. By repeating this sequential gas exposure, i.e., by alternating the two exposures a plurality of times, it is possible to achieve layer by layer growth of about 1 angstrom ($10^{-10}$ m) per cycle. As will be described below, according to another embodiment of the invention, the process chamber may be purged or evacuated to removing any unreacted hafnium precursor, zirconium precursor, byproducts, nitrogen-containing gas, and dopant gas from the process chamber between the sequential and alternating gas pulses.

According to embodiments of the invention, the sequential exposure steps 404, 406, 408 may be repeated a predetermined number of times, as shown by the process flow arrow 414, until a doped hafnium zirconium nitride film ($Hf_xZr_yD'_kN_n$, where x, y, k, and n are non-zero numbers) with a desired thickness has been formed. The desired film thickness can depend on the type of semiconductor device or device region being formed. For example, the film thickness can be greater than 5 nm, greater than 10 nm, greater than 15 nm, greater than 20 nm, greater than 30 nm, or greater than 50 nm. For example, the film thickness can be between greater than 5 nm and 50 nm, between greater than 5 nm and 30 nm, between greater than 5 nm and 20 nm, or between about 5 nm and 10 nm.

According the embodiment depicted in FIG. 4A, the process flow 400 includes a deposition cycle containing sequential and alternating exposures of a gas pulse containing a hafnium precursor, a gas pulse containing a nitrogen-containing gas, a gas pulse containing a zirconium precursor, a gas pulse containing a nitrogen-containing gas, a gas pulse containing a one or more dopant elements, and a gas pulse containing a nitrogen-containing gas. According to another embodiment of the invention, the order of the sequential and alternating exposure steps 404, 406, 408 of the deposition cycle can be changed to effect film growth and film composition.

According to one embodiment of the invention, each of the sequential exposure steps 404, 406, 408 may be independently repeated a predetermined number of times. In one example, if step 404 is denoted by pulse sequence A, step 406 is denoted by a pulse sequence B, and step 408 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium nitride films containing different amounts and different depth profiles of hafnium, zirconium, one or more dopant elements, and nitrogen in the resulting doped hafnium zirconium nitride film.

According to another embodiment of the invention, additional pulse sequences containing additional dopant elements may be added to the process flow depicted in FIG. 4A to form doped hafnium zirconium nitride films containing a additional dopant elements. In other words, additional dopant elements may be incorporated into the films by adding pulse sequences containing a gas pulse containing the additional dopant elements and gas pulse containing a nitrogen-containing gas. In one example, a pulse sequence C containing a gas pulse containing additional dopant elements and a gas pulse containing a nitrogen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 400 may further include steps of purging or evacuating the process chamber after each gas pulse. The purging or evacuating steps can aid in removing any unreacted hafnium precursor, zirconium precursor, byproducts, dopant gas, and nitrogen-containing gas from the process chamber between the alternating gas pulses of hafnium precursor, zirconium precursor, nitrogen-containing gas, and one or more dopant elements.

The exposure steps 404 and 406 may be repeated in sequence a predetermined number of times, as shown by the process flow arrow 412, and exposure steps 406 and 408 may be repeated in sequence a predetermined number of times, as shown by the process flow arrow 410, and exposure steps 404 and 408 may be repeated in sequence a predetermined number of times, as shown by the process flow arrow 414. Furthermore, the exposure steps 404, 406, 408 may be repeated a predetermined number of times as shown by the process arrow 416.

According to one embodiment of the invention, the exposure step 408 is optional and may be omitted in order to deposit hafnium zirconium nitride films that are undoped. Furthermore, the exposure steps 404 and 406 may be repeated a predetermined number of times as shown by the process arrow 418.

FIG. 4B is a process flow diagram for forming a doped hafnium zirconium nitride film according to yet another embodiment of the invention. As seen in FIG. 4B, the process 420 begins when a substrate, such as a semiconductor substrate, is disposed in a process chamber of an ALD or PEALD system in step 422.

In step 424, the substrate is sequentially exposed to a gas pulse containing hafnium and zirconium precursors and a gas pulse with a nitrogen-containing gas. The relative concentration of the hafnium and zirconium precursors may be independently controlled to tailor the composition of the resulting doped hafnium zirconium nitride film. In step 426, the substrate is sequentially exposed to a gas pulse containing a one or more dopant elements and gas pulse containing an a nitrogen-containing gas. According to one embodiment of the invention, the sequential exposure steps 424 and 426 may be repeated a predetermined number of times as depicted by the process flow arrow 428. Furthermore, each of the exposure steps 424 and 426 may be independently repeated a predetermined number of times.

In alternative embodiments, the hafnium and zirconium precursors may be pulsed together, and either or both may be pulsed with the one or more dopant elements to deposit a doped hafnium zirconium nitride film.

According to another embodiment of the invention, the process flow 420 may further include steps of purging or evacuating the process chamber after each gas pulse. The purging or evacuating steps can aid in removing any unreacted hafnium precursor, zirconium precursor, byproducts, nitrogen-containing gas, and dopant gas from the process chamber.

According to one embodiment of the invention, the exposure step 426 is optional and may be omitted in order to deposit hafnium zirconium nitride films that are undoped.

Hafnium Zirconium Oxynitride Films and Doped Hafnium Zirconium Oxynitride Films

Figure 5A:
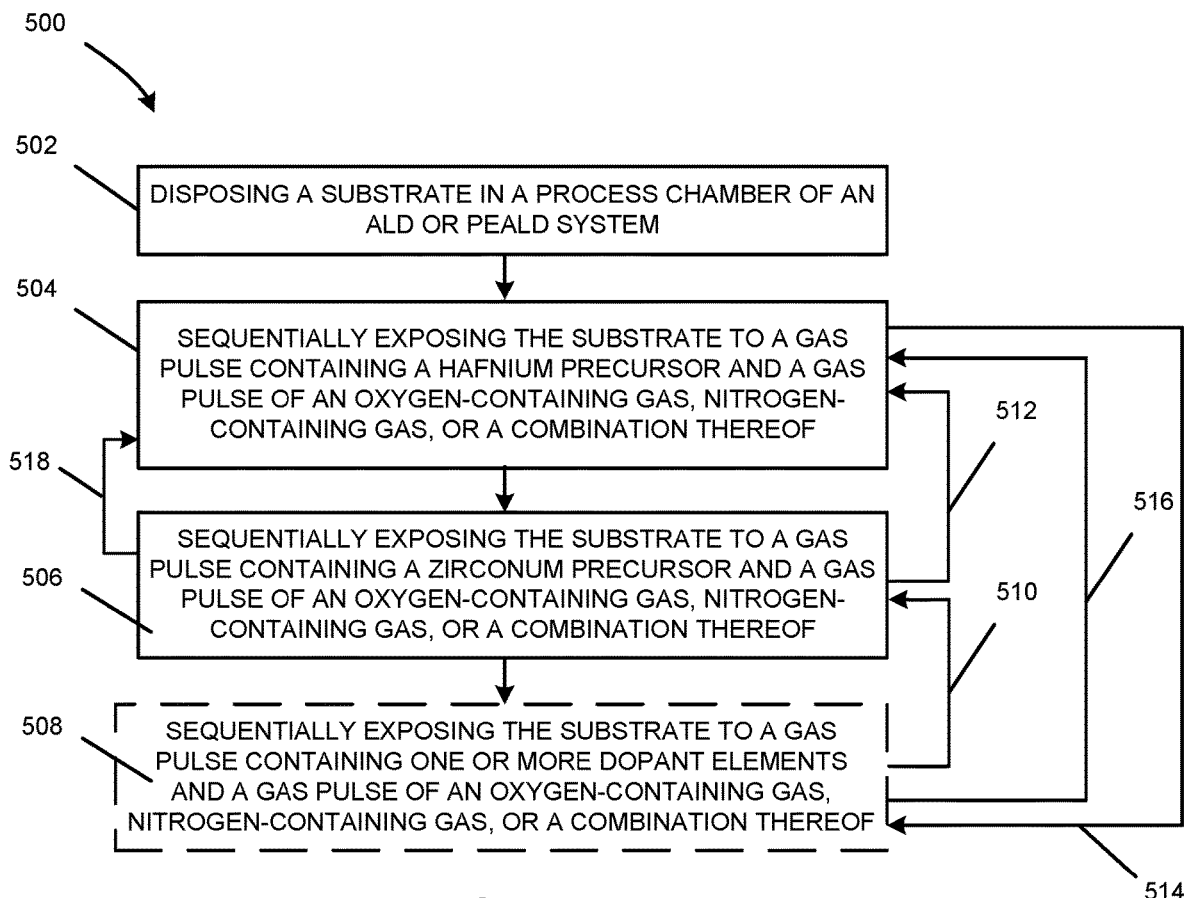
FIGS. 5A-5B are process flow diagrams for forming hafnium zirconium oxynitride films and doped hafnium zirconium oxynitride films according to embodiments of the invention.
Figure 5B:
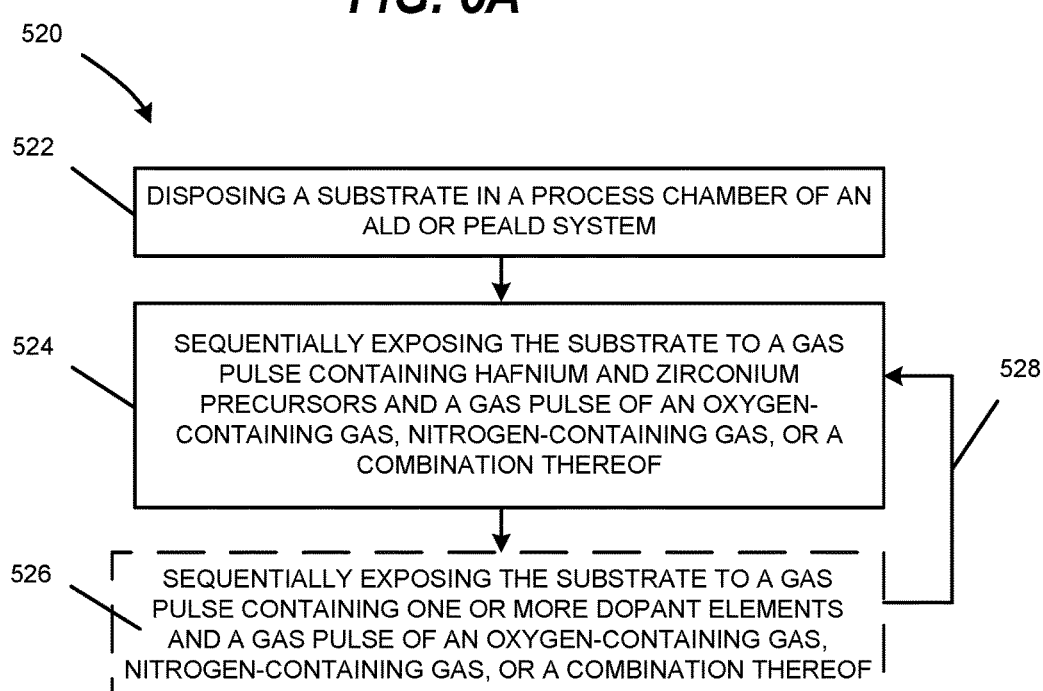

FIGS. 5A-5B are process flow diagrams for forming hafnium zirconium oxynitride and doped hafnium zirconium oxynitride films according embodiments of the invention. The process flows of FIG. 5A-5B may be performed by the ALD/PEALD systems 1/100 of FIGS. 1, 2, or any other suitable ALD/PEALD systems configured to perform an ALD/PEALD process.

In FIG. 5A, the process 500 begins when a substrate, such as a semiconductor substrate, is disposed in a process chamber of an ALD or PEALD system in step 502. In step 504, the substrate is sequentially exposed to a gas pulse containing a hafnium precursor and a gas pulse containing an oxygen-containing gas, a nitrogen-containing gas, or an oxygen and nitrogen-containing gas. In step 506, the substrate is sequentially exposed to a gas pulse containing a zirconium precursor and gas pulse containing the oxygen-containing gas, the nitrogen-containing gas, or the oxygen and nitrogen-containing gas. In step 508, the substrate is sequentially exposed to gas pulse containing one or more dopant elements and a gas pulse containing the oxygen-containing gas, the nitrogen-containing gas, or the oxygen and nitrogen-containing gas. The oxygen-containing gas can include $O_2$, $H_2O$, $H_2O_2$, ozone, or plasma excited oxygen, or a combination thereof, and optionally an inert gas such as Ar. The nitrogen-containing gas can contain $NH_3$, $N_2H_4$, $C_1$-$C_{10}$ alkylhydrazine compounds, or plasma excited nitrogen, or a combination thereof, and optionally an inert gas such as Ar. The oxygen- and nitrogen-containing gas can contain NO, $NO_2$, or $N_2O$, or a combination thereof. In order to incorporate oxygen and nitrogen into the film, the combination of steps 504, 506, and 508 should include at least one gas pulse containing oxygen and at least one gas pulse containing nitrogen.

According to embodiments of the invention, the sequential exposure steps 504, 506, 508 may be repeated a predetermined number of times, as shown by the process flow arrow 514, until a doped hafnium zirconium oxynitride film ($Hf_xZr_yD'_kO_mN_n$, where x, y, k, m, and n are non-zero numbers) with a desired thickness has been formed. The desired film thickness can depend on the type of semiconductor device or device region being formed. For example, the film thickness can be greater than 5 nanometers (nm), greater than 10 nm, greater than 15 nm, greater than 20 nm, greater than 30 nm, or greater than 50 nm. For example, the film thickness can be between greater than 5 nm and 50 nm, between greater than 5 nm and 30 nm, between greater than 5 nm and 20 nm, or between about 5 nm and 10 nm.

According the embodiment depicted in FIG. 5A, the process flow includes a deposition cycle containing sequential and alternating exposures of a gas pulse containing a hafnium precursor, gas pulse containing an oxygen-containing gas, a nitrogen-containing gas, or an oxygen- and nitrogen-containing gas, a gas pulse containing a zirconium precursor, a gas pulse containing an oxygen-containing gas, a nitrogen-containing gas, or an oxygen- and nitrogen-containing gas, a gas pulse containing an dopant gas, and a gas pulse containing an oxygen-containing gas, a nitrogen-containing gas, or an oxygen- and nitrogen-containing gas. According to another embodiment of the invention, the order of the sequential and alternating exposure steps 504, 506, 508 of the deposition cycle can be changed to effect film growth and film composition.

According to one embodiment of the invention, each of the sequential exposure steps 504, 506, 508 may be independently repeated a predetermined number of times. In one example, if step 504 is denoted by pulse sequence A, step 506 is denoted by a pulse sequence B, and step 508 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium oxynitride films containing different amounts and different depth profiles of hafnium, zirconium, the one or more dopant elements, nitrogen, and oxygen in the resulting doped hafnium zirconium oxynitride film.

According to another embodiment of the invention, additional pulse sequences containing additional dopant elements may be added to the process flow depicted in FIG. 5A to form doped hafnium zirconium oxynitride films containing additional dopant elements. In other words, additional dopant elements may be incorporated into the films by adding pulse sequences containing sequential exposures of a gas pulse containing the additional dopant elements and an oxygen-containing gas, a nitrogen-containing gas, or an oxygen- and nitrogen-containing gas for each additional dopant element to be incorporated into the film. In one example, a pulse sequence C containing a gas pulse containing a second dopant gas and an oxygen-, nitrogen- or oxygen and nitrogen-containing gas may be added. Thus, one deposition cycle can, for example, include ABCX, ABBCX, ABCCX, ABCXX, etc. However, embodiments of the invention are not limited to these deposition cycles, as other combinations of A, B, C, and X may be utilized.

According to another embodiment of the invention, the process flow 500 may further include steps of purging or evacuating the process chamber after each gas pulse. The purging or evacuating steps can aid in removing any unreacted hafnium precursor, zirconium precursor, byproducts, dopant gas, oxygen-containing gas, nitrogen-containing gas, or oxygen- and nitrogen-containing gas from the process chamber between the alternating gas pulses.

The exposure steps 504 and 506 may be repeated in sequence a predetermined number of times, as shown by the process flow arrow 512, exposure steps 506 and 508 may be repeated in sequence a predetermined number of times, as shown by the process flow arrow 510, and exposure steps 504 and 508 may be repeated in sequence a predetermined number of times, as shown by the process flow arrow 514. Furthermore, the exposure steps 504, 506, 508 may be repeated a predetermined number of times as shown by the process arrow 516.

According to one embodiment of the invention, the exposure step 508 is optional and may be omitted in order to deposit hafnium zirconium oxynitride films that are undoped. Furthermore, the exposure steps 504 and 506 may be repeated a predetermined number of times as shown by the process arrow 518.

FIG. 5B is a process flow diagram for forming a doped hafnium zirconium oxynitride films according to yet another embodiment of the invention. As seen in FIG. 5B, the process 520 begins when a substrate, such as a semiconductor substrate, is disposed in a process chamber of an ALD or PEALD system in step 522.

In step 524, the substrate is simultaneously exposed to a gas pulse containing hafnium and zirconium precursors and a gas pulse containing an oxygen-containing gas, a nitrogen-containing gas, or an oxygen- and nitrogen-containing gas. The relative concentration of the hafnium and zirconium precursors may be independently controlled to tailor the composition of the resulting doped hafnium zirconium oxynitride film. In step 526, the substrate is sequentially exposed to a gas pulse containing an dopant gas and an a gas pulse containing an oxygen-containing gas, a nitrogen-containing gas, or an oxygen- and nitrogen-containing gas. According to one embodiment of the invention, the sequential exposure steps 524 and 526 may be repeated a predetermined number of times as depicted by the process flow arrow 528.

In alternative embodiments, the hafnium and zirconium precursors may be pulsed together, and either or both may be pulsed with the one or more dopant elements to deposit a doped hafnium zirconium oxynitride film.

According to another embodiment of the invention, the process flow 520 may further include steps of purging or evacuating the process chamber after each gas pulse. The purging or evacuating steps can aid in removing any unreacted hafnium and zirconium precursors, byproducts, oxygen-containing gas, nitrogen-containing gas, oxygen- and nitrogen-containing gas, and dopant gas from the process chamber.

According to one embodiment of the invention, the exposure step 526 is optional and may be omitted in order to deposit hafnium zirconium oxynitride films that are undoped.

According to one embodiment of the invention, the deposited hafnium zirconium oxide, nitride, and oxynitride films may be further processed by exposing the films to ozone, plasma excited oxygen, or plasma excited nitrogen, or a combination thereof. This post-treating can be utilized to further incorporate oxygen, nitrogen, or both oxygen and nitrogen into the films.

Figure 6:
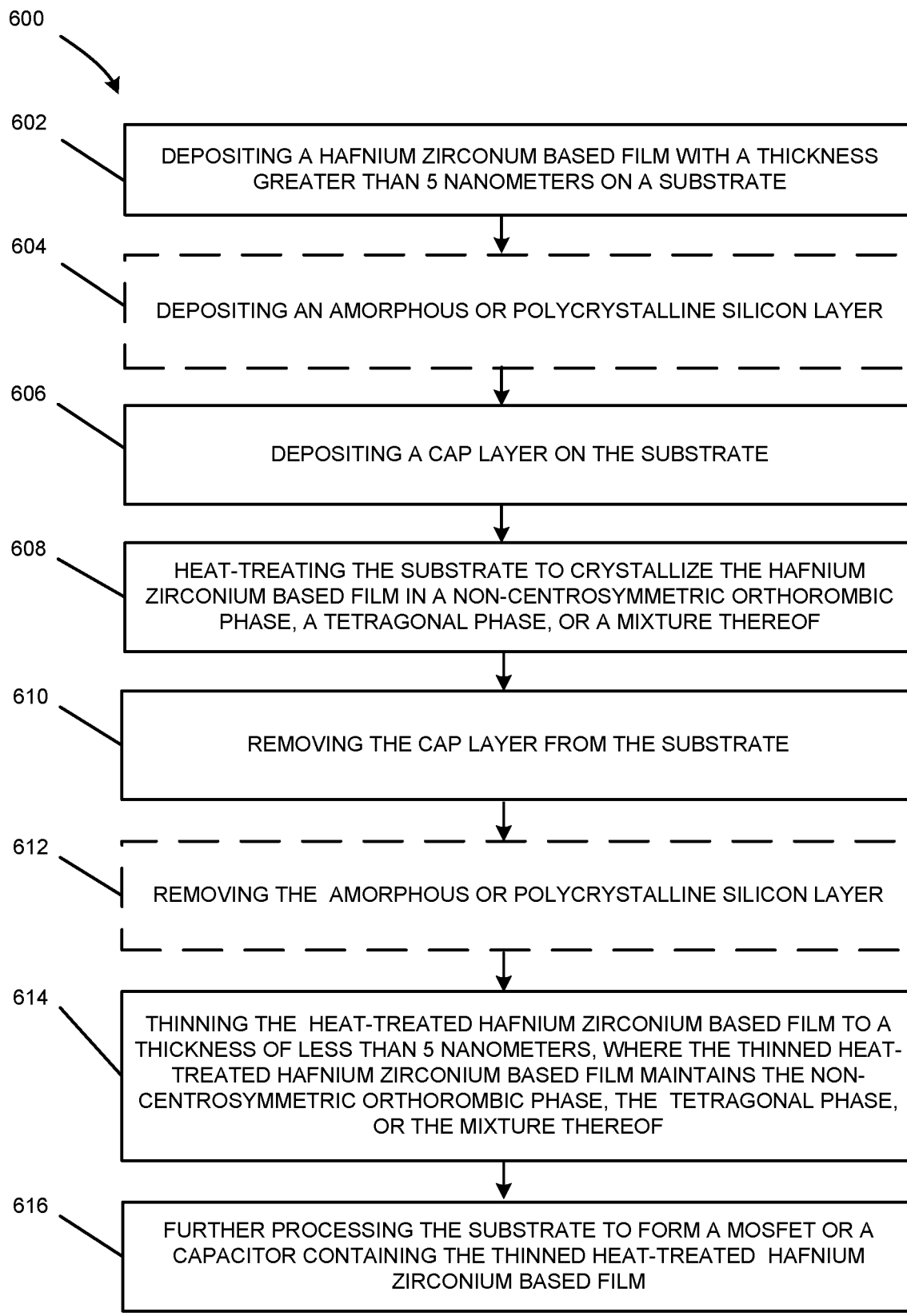
FIG. 6 is a process flow diagram for forming hafnium zirconium based films according to embodiments of the invention.

FIG. 6 is a process flow diagram forming hafnium zirconium based films and doped hafnium zirconium based films according to embodiments of the invention. The process flow 600 includes depositing a hafnium zirconium based film on a substrate in step 602. The substrate can include exposed semiconductor device regions where the hafnium zirconium based film will function as a high-k film in a device. In one example, the device may include a MOSFET or a capacitor. In one example, the hafnium zirconium based film may be deposited by an atomic layer deposition process. In another example, the hafnium zirconium based film may be deposited by a chemical vapor deposition process. In some examples the hafnium zirconium based film may be deposited selectively by using a surface treatment or self-assembled monolayer to block deposition on surfaces on which deposition is not desired. The atomic layer deposition or the chemical vapor deposition process may for example utilize a hafnium or zirconium amide, amidinate, beta-diketonate, guanidinate, alkoxide or cycloptentadienyl precursor. The atomic layer deposition process may for example utilize a hafnium or zirconium halide precursor such as $HfCl_4$ or $ZrCl_4$. The atomic layer deposition process may further include water, oxygen, ozone, hydrogen peroxide or mixtures thereof. During the atomic layer deposition process the wafer surface may be exposed to the hafnium and zirconium precursors separately, e.g. during separate pulses separated by a purge; or the surface may be exposed to the hafnium and zirconium precursors concurrently, e.g. during the same pulse. In one preferred embodiment the hafnium zirconium oxide is deposited by an atomic layer deposition process in which a supercycle comprising one or more hafnium oxide cycles and one or more zirconium oxide cycles is repeated to attain a desired film thickness greater than about 5 nm and a desired composition. The desired Zr percentage calculated as $100\%*[Zr]/[Zr+Hf]$ may be between about 20 and about 80%. In another preferred embodiment the device is a MOSFET and the atomic layer deposition process utilizes water as the oxidant.

In step 604, an amorphous or polycrystalline silicon layer is optionally deposited on the substrate. The silicon layer may at least partially diffuse into the hafnium zirconium based film during a heat-treating process and/or may be used as an etch stop layer during removal of a cap layer that is described below. The silicon layer may be deposited by a chemical vapor deposition (CVD) process or by a physical vapor deposition (PVD) process. The thickness of the Si layer may be between about 1 nm and about 3 nm, or between about 2 nm and about 4 nm, for example.

In step 606, a cap layer is deposited on the substrate. In some examples, the cap layer can include TiN, TaN, TiAlN, TaAlN, AN, or mixtures thereof. In another example, the cap layer comprises Ge, or Ge and Si. The thickness of the cap layer may be between about 1 and about 10 nm. For example, the cap layer may be about 5 nm thick. In some examples the cap layer may be deposited using an atomic layer deposition process, or using a chemical vapor deposition process or some combination thereof. In some examples the atomic layer deposition or the chemical vapor deposition may include the use of a plasma.

In step 608, the substrate is heat-treated to crystallize the hafnium zirconium based film in a non-centrosymmetric orthorhombic phase, a tetragonal phase, or a mixture comprising orthorhombic or tetragonal phases. In some examples the heat treating is between about 300° C. and about 850° C. In other examples the heat treating is between about 400° C. and about 500° C. For example, the heat treating may be performed at about 450° C. The heat treating may be performed as a single wafer anneal or as a batch process. The heat treating time may be between about 0 to 3 minutes, or may be about 1 hour. The heat treating may be accomplished using an ultra-fast anneal at very high temperature for a short period. For example, the heat treating may be accomplished by a rapid thermal anneal or by a laser spike anneal process.

In step 610, the cap layer is removed from the substrate by a dry etching or by a wet etching process. For example, the process may be a wet etching process including dilute hydrofluoric acid. In another example, the wet etching process includes tetramethyl ammonium hydroxide. In another example, the etching process is a dry etching process. In one example, the dry etching process includes the use of a fluorine containing gas. In another example, the dry etching process includes the use of a plasma. In another example, the dry etching process includes the use of a halogen. For example, the dry etching process may include $CHF_3$, or it may include $Cl_2$ as a reactive gas. The dry etching process may further include inert gases such as Ar, $N_2$, etc. In one example, the dry etching process uses $Ar/CHF_3$ and plasma. In another example, the dry etching process uses $Ar/Cl_2$ and a plasma. In some examples the dry etching process may be an atomic layer etching process. The atomic layer etching process may include the use of a B or an Al containing gas and a fluorine containing gas. For example, the atomic layer etching process may include the use of $BCl_3$ and HF. In another example, the atomic layer etching process may include oxidizing all or a portion of the cap layer prior to removing the cap layer. The atomic layer etching process may include a plasma and may further include an inert gas. For example, the atomic layer etching process may include $BCl_3$, Ar and a plasma. Some example, the etching is selective to the hafnium zirconium oxide underneath. In other examples, the etching is selective to the optional silicon layer.

In step 612, the optional amorphous or polycrystalline silicon layer is removed from the substrate using dry or wet etching. The dry or wet etching may be accomplished in a similar manner to the methods described above for removing the cap layer.

In step 614, the hafnium zirconium based film is thinned to a thickness of less than 5 nm, where the thinned heat-treated hafnium zirconium based film maintains the crystallized non-centrosymmetric orthorhombic phase, the tetragonal phase, or the mixture comprising orthorhombic or tetragonal phases, and exhibits ferroelectric behavior during electrical stressing. According to one embodiment, the hafnium zirconium based film is thinned to a thickness of less than 3 nm. The thinning may be accomplished by an atomic layer etching process. In some examples the atomic layer etching process further includes the use of plasma. For example, the atomic layer etching process may include $BCl_3$, Ar and a plasma. In other examples the atomic layer etching may be accomplished using a B or an Al containing reagent and a fluorine containing gas. For example, the atomic layer etching may be accomplished using BCl$_3$ and HF. In another example, the atomic layer etching may be accomplished using trimethylaluminum and HF.

In step 616, the substrate the further processed to form a MOSFET, a tunnel junction, a diode, a resistive memory, or a capacitor.

A method of forming crystallographically stabilized ferroelectric hafnium zirconium based films for semiconductor devices have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
    depositing a hafnium zirconium based film with a thickness greater than 5 nanometers on a substrate;
    depositing a cap layer on the hafnium zirconium based film;
    heat-treating the substrate to crystallize the hafnium zirconium based film in a non-centrosymmetric orthorhombic phase, a tetragonal phase, or a mixture thereof;
    removing the cap layer from the substrate; and
    thinning the heat-treated hafnium zirconium based film to a thickness of less than 5 nanometers, wherein the thinned heat-treated hafnium zirconium based film maintains the crystallized non-centrosymmetric orthorhombic phase, the tetragonal phase, or the mixture thereof.

2. The method of claim 1, wherein the heat-treated hafnium zirconium based film is thinned to a thickness of less than 3 nm.

3. The method of claim 1, wherein the cap layer includes TiN, TaN, TiAlN, TaAlN, AlN, or a combination thereof.

4. The method of claim 1, wherein the cap layer includes Ge, or Ge and Si.

5. The method of claim 1, wherein the heat-treating includes heating the substrate to a temperature between about 300° C. and about 850° C.

6. The method of claim 1, wherein the thinning is performed by atomic layer etching (ALE).

7. The method of claim 6, wherein the ALE includes alternating exposures of a B-containing gas or an Al-containing gas, and a fluorine containing gas.

8. The method of claim 6, wherein the ALE includes alternating exposures of BCl$_3$ gas and HF gas.

9. The method of claim 1, further comprising:
    prior to depositing the cap layer, depositing an amorphous or polycrystalline silicon layer on the hafnium zirconium based film.

10. The method of claim 9, further comprising:
    removing the amorphous or polycrystalline silicon layer from the heat-treated hafnium zirconium based film.

11. The method of claim 1, further comprising:
    further processing the substrate to form a MOSFET, a tunnel junction, a diode, a resistive memory, or a capacitor containing the thinned heat-treated hafnium zirconium based film.

12. The method of claim 1, wherein the hafnium zirconium based film includes a hafnium zirconium oxide film, a hafnium zirconium nitride film, a hafnium zirconium oxynitride film, a doped hafnium zirconium oxide film, a doped hafnium zirconium nitride film, or a doped hafnium zirconium oxynitride film.

13. The method of claim 12, wherein the doped hafnium zirconium oxide film, the doped hafnium zirconium nitride film, or the doped hafnium zirconium oxynitride film contain a dopant element selected from Be, Mg, Ca, Sr, Ba, Ra, B, Al, Ga, In, Tl, Si, Y, Lu, La, Ce, Pr, Nd, Sm, Eu, Gd, Th, Dy, Ho, Er, Tm, and Yb.

14. A substrate processing method, comprising:
    depositing a hafnium zirconium oxide film with a thickness greater than 5 nanometers on a substrate;
    depositing a cap layer on the hafnium zirconium oxide film, wherein the cap layer includes TiN, TaN, TiAlN, TaAlN, AlN, or a combination thereof;
    heat-treating the substrate at a temperature between about 300° C. and about 850° C. to crystallize the hafnium zirconium oxide film in a non-centrosymmetric orthorhombic phase, a tetragonal phase, or a mixture thereof;
    removing the cap layer from the substrate; and
    thinning the heat-treated hafnium zirconium oxide film by atomic layer etching (ALE) to a thickness of less than 5 nm, wherein the thinned heat-treated hafnium zirconium oxide film maintains the crystallized non-centrosymmetric orthorhombic phase, the tetragonal phase, or the mixture thereof.

15. The method of claim 14, wherein the heat-treated hafnium zirconium oxide film is thinned to a thickness of less than 3 nanometers.

16. The method of claim 14, wherein the ALE includes alternating exposures of a B-containing gas or an Al-containing gas, and a fluorine containing gas.

17. The method of claim 14, wherein the ALE includes alternating exposures of BCl$_3$ gas and HF gas.

18. The method of claim 14, further comprising:
    prior to depositing the cap layer, depositing an amorphous or polycrystalline silicon layer on the hafnium zirconium oxide film.

19. The method of claim 18, further comprising:
    removing the amorphous or polycrystalline silicon layer from the heat-treated hafnium zirconium oxide film.

20. The method of claim 14, further comprising:
    further processing the substrate to form a MOSFET, a tunnel junction, a diode, a resistive memory, or a capacitor containing the thinned heat-treated hafnium zirconium oxide film.

* * * * *